United States Patent
Sadighi et al.

(10) Patent No.: US 7,085,622 B2
(45) Date of Patent: Aug. 1, 2006

(54) VISION SYSTEM

(75) Inventors: Iraj Sadighi, Round Rock, TX (US); Jeff Hudgens, San Francisco, CA (US); Michael Rice, Pleasanton, CA (US); Gary Wyka, Austin, TX (US)

(73) Assignee: Applied Material, Inc., Santa Clara, CA (US)

( * ) Notice: Subject to any disclaimer, the term of this patent is extended or adjusted under 35 U.S.C. 154(b) by 685 days.

(21) Appl. No.: 10/126,493

(22) Filed: Apr. 19, 2002

(65) Prior Publication Data

US 2003/0198376 A1 Oct. 23, 2003

(51) Int. Cl.
*G06F 19/00* (2006.01)

(52) U.S. Cl. .................. 700/245; 700/258; 348/86; 348/87; 348/94; 318/568.16; 318/625; 250/559.45

(58) Field of Classification Search ............ 700/245, 700/258; 356/138, 147, 237.4–237.5; 348/86–87, 348/94; 355/27, 72; 250/559.22, 559.45; 438/16; 382/149; 451/6, 348; 316/568.16; 318/625; 414/321, 936, 941
See application file for complete search history.

(56) References Cited

U.S. PATENT DOCUMENTS

| | | | |
|---|---|---|---|
| 4,119,381 A | 10/1978 | Muka et al. | |
| 4,819,167 A | 4/1989 | Cheng et al. | 364/167.01 |
| 5,012,574 A | 5/1991 | Pryor | |
| 5,435,682 A | 7/1995 | Crabb et al. | |
| 5,446,584 A * | 8/1995 | Bacchi et al. | 359/393 |
| 5,452,521 A | 9/1995 | Niewmierzycki | 33/520 |
| 5,479,252 A | 12/1995 | Worster et al. | |
| 5,483,138 A | 1/1996 | Shmookler et al. | 318/568.16 |
| 5,552,891 A | 9/1996 | Balzer | |
| 5,563,798 A | 10/1996 | Berken et al. | |
| 5,699,447 A | 12/1997 | Alumot et al. | |
| 5,717,785 A | 2/1998 | Silver | |
| 5,738,574 A | 4/1998 | Tolles et al. | |
| 5,808,744 A | 9/1998 | Moriya | |
| 5,844,683 A | 12/1998 | Pavloski et al. | 356/399 |
| 5,889,593 A | 3/1999 | Bareket | |
| 5,917,601 A | 6/1999 | Shimazaki et al. | 356/375 |
| 5,946,083 A | 8/1999 | Melendez et al. | |
| 5,953,447 A | 9/1999 | Jin | |
| 5,980,194 A | 11/1999 | Freerks et al. | 414/754 |
| 6,002,840 A | 12/1999 | Hofmeister | 395/80 |
| 6,012,965 A | 1/2000 | Savoie | |

(Continued)

FOREIGN PATENT DOCUMENTS

JP 2001-210692 8/2001

(Continued)

OTHER PUBLICATIONS

Ma et al., Optical coordination sensor for precision cooperating robots, 2000, IEEE, p. 1621-1626.*

(Continued)

*Primary Examiner*—Thomas G. Black
*Assistant Examiner*—McDieunel Marc
(74) *Attorney, Agent, or Firm*—Patterson & Sheridan, LLP

(57) ABSTRACT

Generally a method and apparatus for viewing images within a processing system is provided. In one embodiment, an apparatus includes a plate having a camera, transmitter and battery coupled thereto. The plate is adapted to be transported about a semiconductor processing system by a substrate transfer robot thereby allowing images within the system to be viewed remotely from the system. The viewed images may be used for system inspection and calibration of robot position, among other uses.

21 Claims, 13 Drawing Sheets

U.S. PATENT DOCUMENTS

| | | | |
|---|---|---|---|
| 6,016,358 A | 1/2000 | Balamurugan | |
| 6,051,113 A | 4/2000 | Moslehi | 204/192.12 |
| 6,068,539 A | 5/2000 | Bajaj et al. | |
| 6,086,453 A | 7/2000 | Fukuoka et al. | |
| 6,135,854 A | 10/2000 | Masumura et al. | |
| 6,198,976 B1 | 3/2001 | Sundar et al. | 700/59 |
| 6,244,121 B1 | 6/2001 | Hunter | 73/865.9 |
| 6,313,596 B1* | 11/2001 | Wyka et al. | 318/640 |
| 6,352,466 B1 | 3/2002 | Moore | |
| 6,368,049 B1 | 4/2002 | Osaka et al. | |
| 6,468,816 B1 | 10/2002 | Hunter | 438/14 |
| 6,477,265 B1 | 11/2002 | Sheng | |
| 6,532,403 B1 | 3/2003 | Beckhart et al. | |
| 6,577,382 B1* | 6/2003 | Kida et al. | 355/77 |
| 6,630,995 B1* | 10/2003 | Hunter | 356/237.5 |
| 6,648,730 B1* | 11/2003 | Chokshi et al. | 451/6 |
| 6,671,660 B1 | 12/2003 | Freed | |
| 6,691,068 B1 | 2/2004 | Freed et al. | |
| 6,693,708 B1* | 2/2004 | Hunter | 356/237.5 |
| 6,697,517 B1* | 2/2004 | Hunter | 382/149 |
| 6,707,544 B1* | 3/2004 | Hunter et al. | 356/237.5 |
| 6,707,545 B1* | 3/2004 | Hunter | 356/237.5 |
| 6,721,045 B1* | 4/2004 | Hunter | 356/237.5 |
| 6,882,416 B1* | 4/2005 | Hunter et al. | 356/237.4 |
| 2002/0038164 A1 | 3/2002 | Osaka et al. | |
| 2002/0068992 A1 | 6/2002 | Hine et al. | |
| 2002/0078770 A1 | 6/2002 | Hunter | 73/865.9 |
| 2002/0092369 A1 | 7/2002 | Hunter | 73/865.9 |
| 2002/0101508 A1 | 8/2002 | Pollack | 348/85 |
| 2002/0103571 A1 | 8/2002 | Yoo et al. | |
| 2003/0001083 A1 | 1/2003 | Corrado et al. | 250/239 |
| 2003/0198376 A1* | 10/2003 | Sadighi et al. | 382/153 |
| 2003/0202092 A1* | 10/2003 | Sadighi et al. | 348/87 |
| 2004/0243320 A1* | 12/2004 | Chang et al. | 702/30 |
| 2004/0258514 A1* | 12/2004 | Raaijmakers | 414/935 |
| 2005/0045214 A1* | 3/2005 | Davis et al. | 134/78 |
| 2005/0137751 A1* | 6/2005 | Cox et al. | 700/245 |
| 2005/0142293 A1* | 6/2005 | Ready et al. | 427/258 |
| 2005/0190957 A1* | 9/2005 | Cai et al. | 382/141 |
| 2005/0233770 A1* | 10/2005 | Ramsey et al. | 455/561 |

FOREIGN PATENT DOCUMENTS

| | | |
|---|---|---|
| WO | WO 02/29385 A2 | 4/2002 |
| WO | WO 02/29393 A2 | 4/2002 |
| WO | WO 02/29885 A2 | 4/2002 |
| WO | WO 02/35217 A2 | 5/2002 |
| WO | WO02/083372 | 10/2002 |
| WO | WO 03/067183 | 8/2003 |
| WO | WO2004/007150 | 1/2004 |

OTHER PUBLICATIONS

Copy of International Search Report dated Sep. 2, 2004 for corresponding PCT application, PCT/US2004/007202.

U.S. Appl. No. 09/703,061, filed Oct. 30, 2000, Chokshi et al.

"Wafercam™ System: Wireless Camera System for Semiconductor Processing Robotic Arm Calibration", www.gtweed.com/semiconductor/Wafercam.htm, printed Dec. 10, 2002.

* cited by examiner

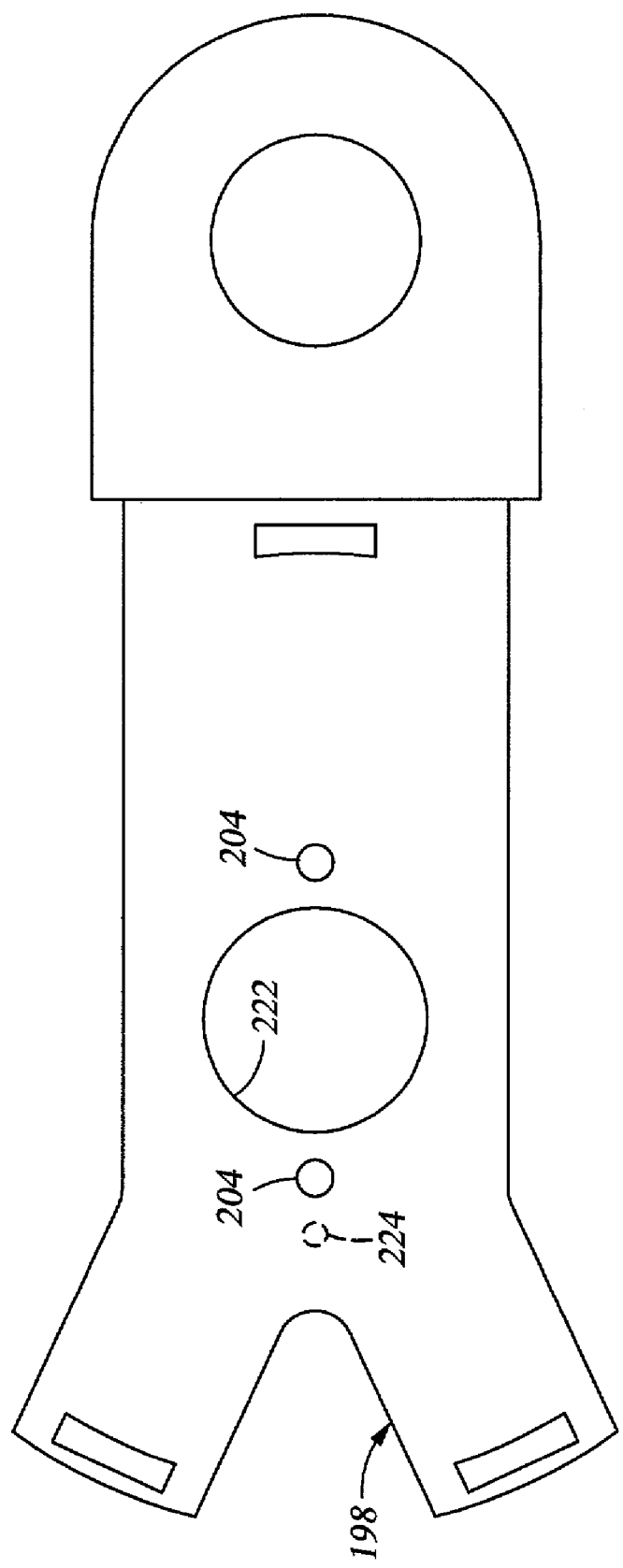

VISION SYSTEM

BACKGROUND OF THE DISCLOSURE

1. Field of the Invention

Embodiments of the present invention relate generally to a vision system, a method for inspecting a processing system and a method for determining the position of an object within a processing system.

2. Background of the Invention

The use of robots in automated processing systems has become increasingly popular. Robots can often perform repeated tasks with the precision and efficiency generally not achievable through the use of human labor. Moreover, robots can be used in locations where the proximity to moving components or sensitive environments makes the use of human labor in such locations undesirable.

This is particularly important in semiconductor processing systems where misplaced or out-of-position substrates result in costly damage or/and unscheduled system maintenance. Misaligned substrates are often damaged, damage other substrates or equipment, or are poorly processed due to misalignment and may be discarded. For example, a substrate disposed on an end effector of a robot of a semiconductor processing system may come into contact with a misaligned substrate during movement of the substrate that is secured to the robot. If the substrates contact one another, one or both of the substrates may become damaged. Moreover, if one or both of the substrates become dislodged, the system must be shut down for the removal of the substrate before further processing can occur. If retrieval of the dislodged substrate requires accessing interior portions of the system operating under vacuum, hours of production time will be lost for decontamination and reestablishment of a vacuum environment within the effected chambers.

In order to ensure precise positioning of substrates moved by the robot, reference points or coordinates for a desired or predetermined position of the robot's end effector is typically entered into a memory of a robot controller as part of a calibration procedure. Acquiring the reference coordinates generally involves jogging the end effector to the predetermined position, typically through a manual or an automated sequence. Arrival of the robot's end effector at the predetermined position may be confirmed by manually observing the end effector position, or by having the end effector (or other component of the robot) trigger a sensor, such as a limit switch. This sequence is typically repeated until all the reference coordinates for each critical position within the robot's range of motion throughout the system has been established (i.e., entered into the robot's or robot controller's memory). Once the reference coordinates have been established, the robot can move the end effector with precision and accuracy into critical positions by returning to the reference coordinates.

In many semiconductor processing systems, jogging of the robot's end effector and the confirmation of the end effector's arrival at the reference coordinate is done manually. An operator must observe the location of the end effector relative to an object or target within the processing system to visually estimate the position of the end effector. In order to adequately view the end effector when performing this task, the processing system is typically opened to the surrounding environmental. This undesirably places the operator in a position exposed to the range of motion of the robot were personal injury or system damage may occur. Thus, to prevent possible injury to the operator, the processing system is normally shut down so that the robot does not inadvertently make contact with the operator, possibly damaging product, tooling or the operator. As the system is exposed to the surrounding environment, decontamination procedures must be performed prior to processing. Moreover, lengthy pump-downs must be performed to return the system to operation pressures. During periods where the system is shut down, no wafers are processed and valuable production time is lost. This all results in undesirable loss of production capacity that must be repeated wherever recalibration is needed.

Therefore, a need exists for an improved calibration and method for determining the position of an object.

SUMMARY OF THE INVENTION

One aspect of the present invention generally provides an apparatus for viewing images within a semiconductor processing system. In one embodiment, an apparatus includes a plate having a camera, transmitter and battery coupled thereto. The plate is adapted to be transported about a semiconductor processing system by a substrate transfer robot thereby allowing images within the system to be viewed remotely from the system. The viewed images may be used for system inspection and calibration of robot position, among other uses.

In another aspect of the invention, a vision system for a semiconductor processing system is provided. In one embodiment, a vision system includes at least one robot adapted for use in a semiconductor processing system having an end effector. A camera is disposed on the robot and has a transmitter coupled thereto. Images transmitted by the camera are received by a receiver. Optionally, the images may be displayed on a monitor.

In another aspect of the invention, a method for obtaining a view of an interior of a semiconductor processing system is provided. In one embodiment, a method for obtaining a view of an interior of a semiconductor processing system includes moving a camera using a robot disposed in a semiconductor processing system, transmitting images captured by the camera and remotely receiving the captured images.

In another embodiment, a method for obtaining a view of an interior of a semiconductor processing system includes moving a camera using a robot disposed in a semiconductor processing system, transmitting images captured by the camera, remotely receiving the captured images and interpreting the captured images.

In another embodiment, a method for obtaining a reference coordinates of a robot disposed in a semiconductor processing system includes positioning a camera on a robot, viewing a target with a camera and determining a relative distance between an image of the target and a predefined position.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and, therefore, are not to be considered limiting of its scope, for the invention may admit to other equally effective embodiments.

FIG. 2C is a top view of one embodiment of an end effector;

To facilitate understanding, identical reference numerals have been used, where possible, to designate identical elements that are common to the figures.

DETAILED DESCRIPTION

The present invention generally provides a vision system for capturing images within in a semiconductor processing system and related equipment. The images may be used to calibrate a position of a robot's end effector and for system inspection. The invention is illustratively described below with reference to determining the position of a robot's end effector within a semiconductor processing system or cluster tool. However, it should be understood that the invention may be utilized to perform a variety of inspection and/or calibration functions within a semiconductor processing system without having to open the system to the ambient (i.e., surrounding) environment. Moreover, the invention has utility in other semiconductor processing system configurations, such as chemical mechanical polishing systems, electrochemical deposition and polishing systems, where images acquired from a mobile camera are desired.

Figure 1:
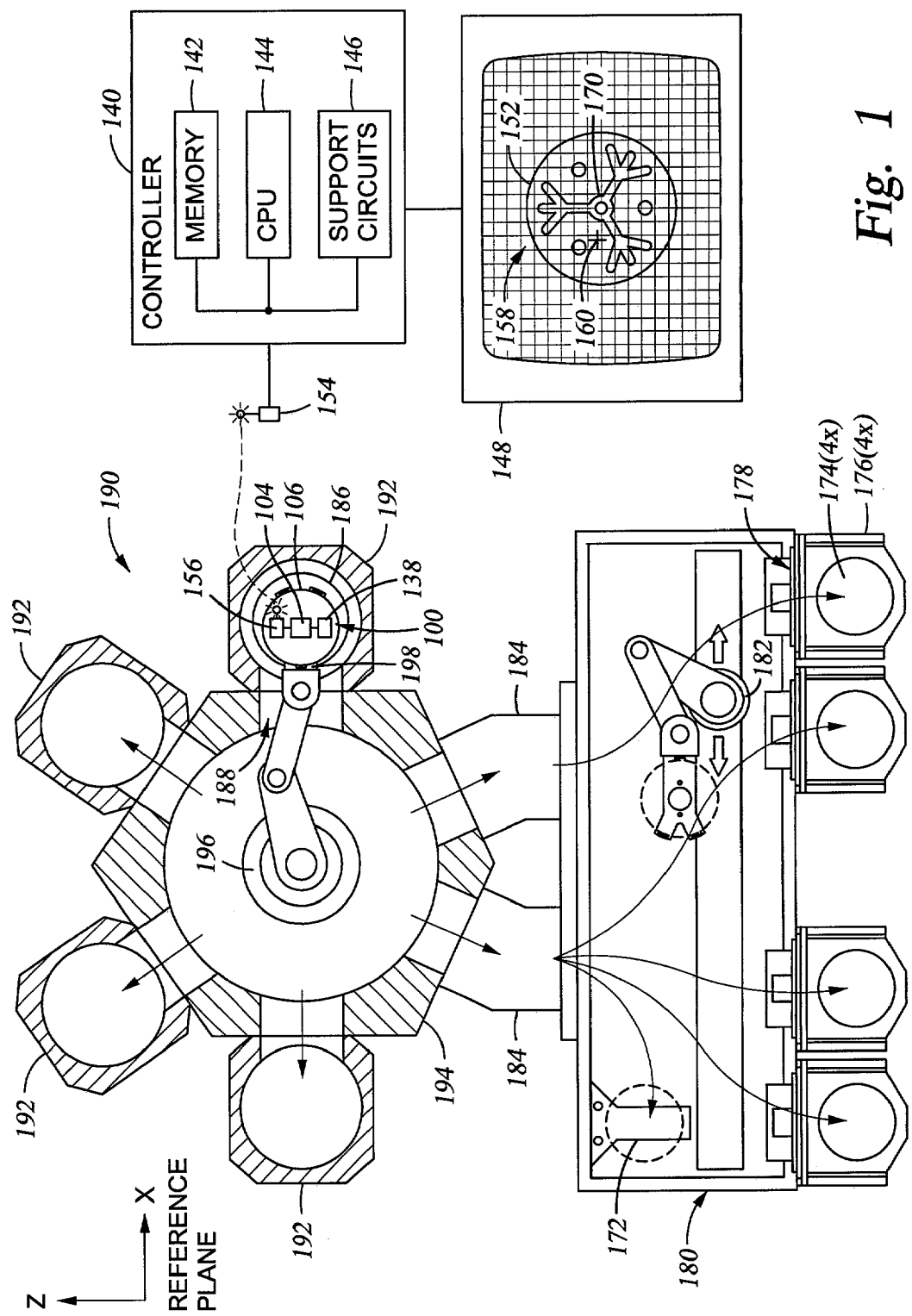
FIG. 1 depicts a simplified plan view of a cluster tool and vision system.

FIG. 1 depicts one embodiment of an exemplary processing system 190 including a vision system 150 that may be utilized to capture images within the processing system 190. The vision system 150 generally includes a camera assembly 100 and a controller 140 for processing and/or displaying images viewed by the camera assembly 100. The camera assembly 100 is adapted to be transported about the system 190 by one or more substrate transfer robots of the system 190. Thus, images supplied by the camera assembly 100 to the controller 140 may be utilized to determine the position of the robot for calibration purposes and/or for visual chamber inspection without having to expose the interior of the system 190 to the surrounding environment. The images obtained by the camera assembly 100 may also be utilized for other purposes.

The illustrative processing system 190 depicted in FIG. 1 generally includes a central transfer chamber 194 having a plurality of processing chambers 192 coupled thereto. The processing chambers 192 may be any type of processing chamber associated with semiconductor processing, including, but not limited to, chemical vapor deposition chambers, atomic layer deposition chambers, physical vapor deposition chambers, orientation chambers, degas chambers, pre-clean chambers, etch chamber and thermal processing chambers, among others. Examples of such processing chambers are available from Applied Materials, Inc, located in Santa Clara, Calif., and may be utilized with transfer chambers also available from Applied Materials, Inc., for example, PRODUCER), ENDURA) and CENTURA) families of processing platforms.

A port 188 is defined between each processing chamber 192 and the transfer chamber 194 to allow entry and egress of substrates (and camera assembly 100) from the processing chamber 192. The port 188 is selectively sealed by a slit valve (omitted from the FIG. 1 for clarity). A transfer robot 196 having an end effector 198 is centrally disposed in the transfer chamber 104 to facilitate transfer of substrates (and camera assembly 100) to the surrounding processing chambers 192. One example of a transfer robot that may be utilized is a VHP) robot, also available from Applied Materials, Inc. Other robots may also be used.

One or more load lock chambers 184 are coupled between the transfer chamber 104 and a factory interface 180. Two load lock chambers 184 are shown in the embodiment depicted in FIG. 1. The load lock chambers 184 facilitate substrate transfer between a vacuum environment of the transfer chamber 194 and a substantially ambient environment of the factory interface 180. One example of a load lock chamber that may be utilized is described in U.S. Pat. No. 6,270,582, issued Aug. 7, 2001 to Rivkin et al., and is hereby incorporated by reference in its entirety.

The factory interface 180 has an interface robot 182 and includes a plurality of bays 178 that are adapted to receive a substrate storage cassettes 174. Each cassette 174 is configured to store a plurality of substrates 174 therein. The factory interface 180 is generally maintained at or near atmospheric pressure. In one embodiment, filtered air is supplied to the factory interface 180 to minimize the concentration of particles within the factory interface and correspondingly substrate cleanliness. One example of a factory interface that may be adapted to benefit from the invention is described in U.S. patent application Ser. No. 09/161,970 filed Sep. 28, 1998 by Kroeker, which is hereby incorporated by reference in its entirety.

The interface robot 182 is generally similar to the transfer robot 196 described above. The interface robot 182 includes an end effector similar to the end effector 198 of the transfer robot 196, and accordingly will be referred to by the same reference numeral. The interface robot 182 is adapted to transfer substrates between the cassettes 176 and the load lock chambers 184.

A docking station 172 may be disposed in the factory interface 180. The docking station 172 provides a storage area for the camera assembly 100 within the system 190 so that calibration, re-calibration or inspection procedures are facilitated without requiring the camera assembly 100 to be introduced into the system 190 through the cassettes 174 or other access port. Alternatively, the docking station 172 may be located in other locations within the system 190. In another embodiment, the camera assembly 100 may be stored in the cassette 174 to allow introduction or removal from the system 190. Alternatively, the camera assembly 100 may be removed from the system 190 when not in use. One embodiment of a docking station 172 is described further below with reference to FIGS. 3A–B.

As the camera assembly 100 is adapted to be transported by the robots 196, 182, calibration of a position of the end effector 198 may be obtained at any position within the processing system 190. For example, the camera assembly 100 may be used to calibrate the transfer robot's position in any one of the processing chamber 192, the transfer chamber 194 or the load lock chamber 184 to ensure accurate and repeatable placement of the substrate therein. The camera assembly 100 may be used to calibrate the position of the end effector 198 of the factory interface robot 182 in any one of the substrate storage cassettes 176, the load lock chamber 184 or the docking station 172. Accurate positioning of the substrate enhances process repeatability while reducing damage to substrates and equipment due to substrate misalignment. Moreover, the mobility of the camera assembly 100 allows for calibration and visual inspection of the interior of the processing system 190 to occur without loss of vacuum within the transfer and processing chambers 194, 192, or risk of personal injury. Furthermore, as processing may continue while inspection/calibration is performed, productivity is enhanced.

The camera assembly 100 generally comprises a camera 104, a power source 138, and a transmitter 156 disposed on a locating plate 106. The camera assembly 100 should have a height that allows for transfer through the various slit valves and ports within the system 190, and should have a weight similar to that of a substrate as not to excessively cause the end effector 198 of the robot 196 to sag when disposed thereon.

The locating plate 106 is typically comprised of aluminum, stainless steel, plastic or other rigid material. In embodiments in which the camera assembly 100 is subjected to high temperature, for example, in a processing chamber 192 performing chemical vapor deposition at temperatures above about 350 degrees Celsius, the locating plate 106 is preferably comprised of a non-conductive material having a small coefficient of thermal expansion. The locating plate 106 is generally configured to support the camera 104 while on the end effector 198 of the transfer robot 196.

The loading plate 106 may be of any shape or geometry sufficient to support the camera 104 on the end effector 198 without being prone to dislodge from the robot during transfer. In one embodiment, at least a portion of a perimeter of the locating plate 106 has a radius configured to replicate (i.e., is substantially identical to) a conventional substrate. For example, the locating plate 106 may include at least a portion of its perimeter having about 150 mm, about 100 mm or about 50 mm radius to replicate the size of a 300 mm, a 200 mm or 100 mm substrate. An alternative configuration of the locating plate 106 may replicate other standard, conventional or custom sized substrates, including polygonal flat panels.

The camera 104 is adapted to capture images within the processing system 190. The camera 104 provide single or video images. In one embodiment, the camera is a monochrome board mounted camera available from Edmund Industrial Optics, located in Barrington, N.J.

The power source 138 generally provides power to the camera 104 and the transmitter 156. The power source 138 may be remote such as facility power or self-contained on the camera assembly 100 such as a battery.

In one embodiment, the power source 138 is a battery that is suitable for use in a vacuum environment. Preferably, the power source 138 is suitable for intermittent use at temperatures above about 200 degrees Celsius. One power source 138 is a battery model number 3S1P, available from South-West Electronics Energy Corporation.

The transmitter 156 produces a signal that is indicative of the image viewed by the camera 104. The transmitter 156 may provide the signal to the controller via control wire running through the robots or by broadcast signal (i.e., wireless signal). One transmitter that may be utilized is MVT-10 available from Supercircuits.

The controller 140 is adapted to receive images viewed by the camera 104 from the transmitter 156. The controller 140 includes a central processing unit (CPU) 144, support circuits 146 and memory 142. The CPU 144 may be one of any form of computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry, subsystems, and the like.

A receiver 154 is coupled to the controller 140 to facilitate transfer of the signal generated by the transmitter 156 to the controller 140. One receiver that may be utilized is MVR-10, available from Supercircuits. Optionally, a monitor 148 may be coupled to the controller 140 for viewing of images from the camera 104.

Figure 2A:
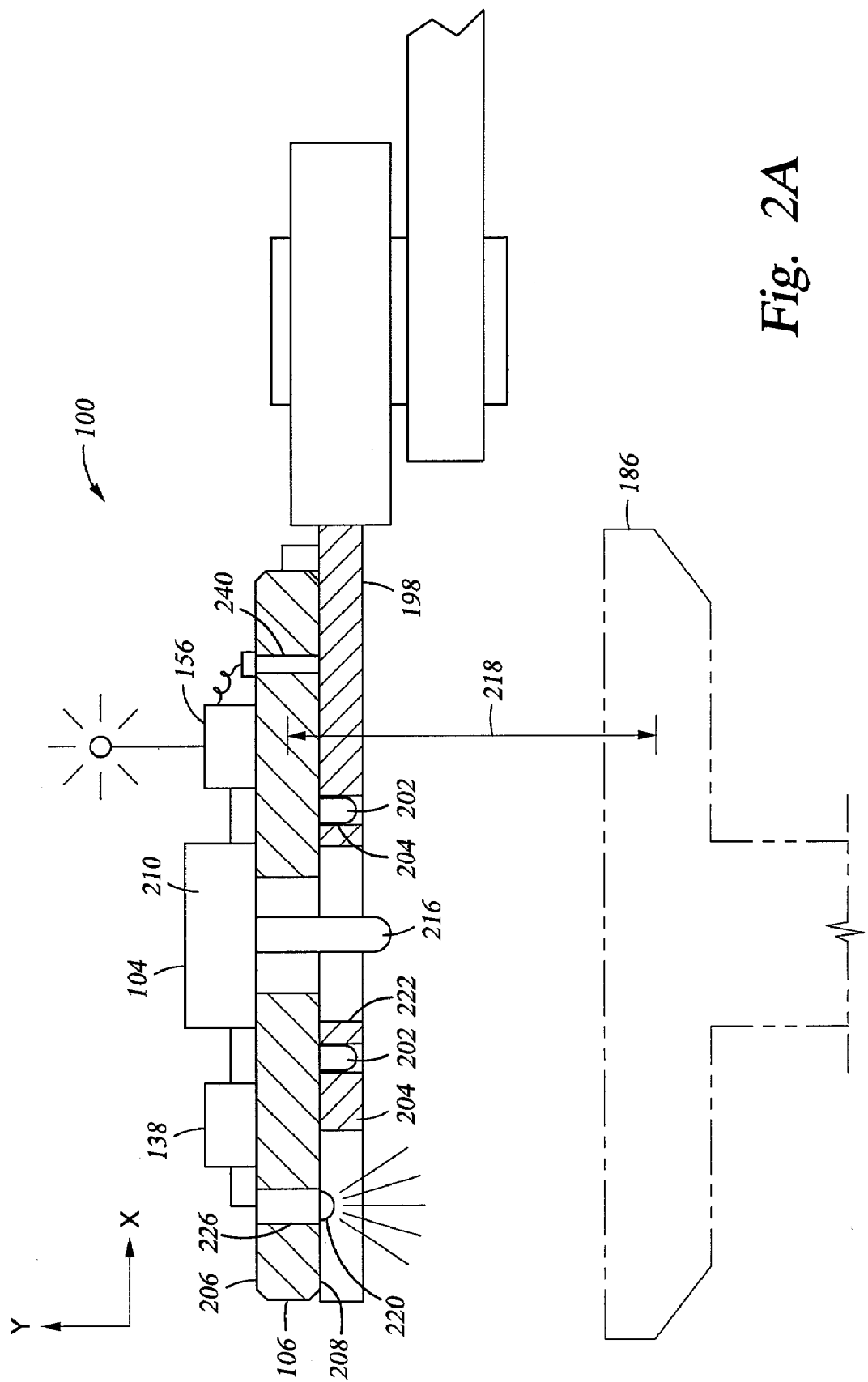
FIG. 2A is a front view of one embodiment of a camera assembly disposed on an end effector of a robot.

FIG. 2A depicts a plan view of the camera assembly 100 supported by the end effector 198 disposed below the locating plate 106. As depicted in FIG. 2A, the locating plate 106 includes one or more locating pins 202 that interface with a respective hole 204 formed in the end effector 198 of the robot to enhance the positional accuracy between the locating plate 106 with the end effector 198 of the robot. The pins 202 extend from a first side 206 of the locating plate 106 that faces the end effector 198, while an opposing second side 208 of the plate 106 supports the transmitter 156.

The locating plate 106 additionally includes an aperture 210 disposed therethrough that aligns with a corresponding aperture 222 formed through the end effector 198. The aperture 210 may be a hole formed in the plate 106 or a transparent portion of the plate 106 that facilitates viewing objects on the first side 206 of the plate 106 opposite the camera 104. In the embodiment depicted in FIG. 2A, the aperture 210 allows a lens 216 of the cameral 104 to extend through the locating plate 106 to a position below the first side 206. The lens 216 is selected to have a depth of field 218 such that the object to be viewed by the camera 104 will be in focus. In one embodiment, the lens 216 has a 4.7 mm focal length lens, and is also available from Edmund Industrial Optics.

Figure 2B:
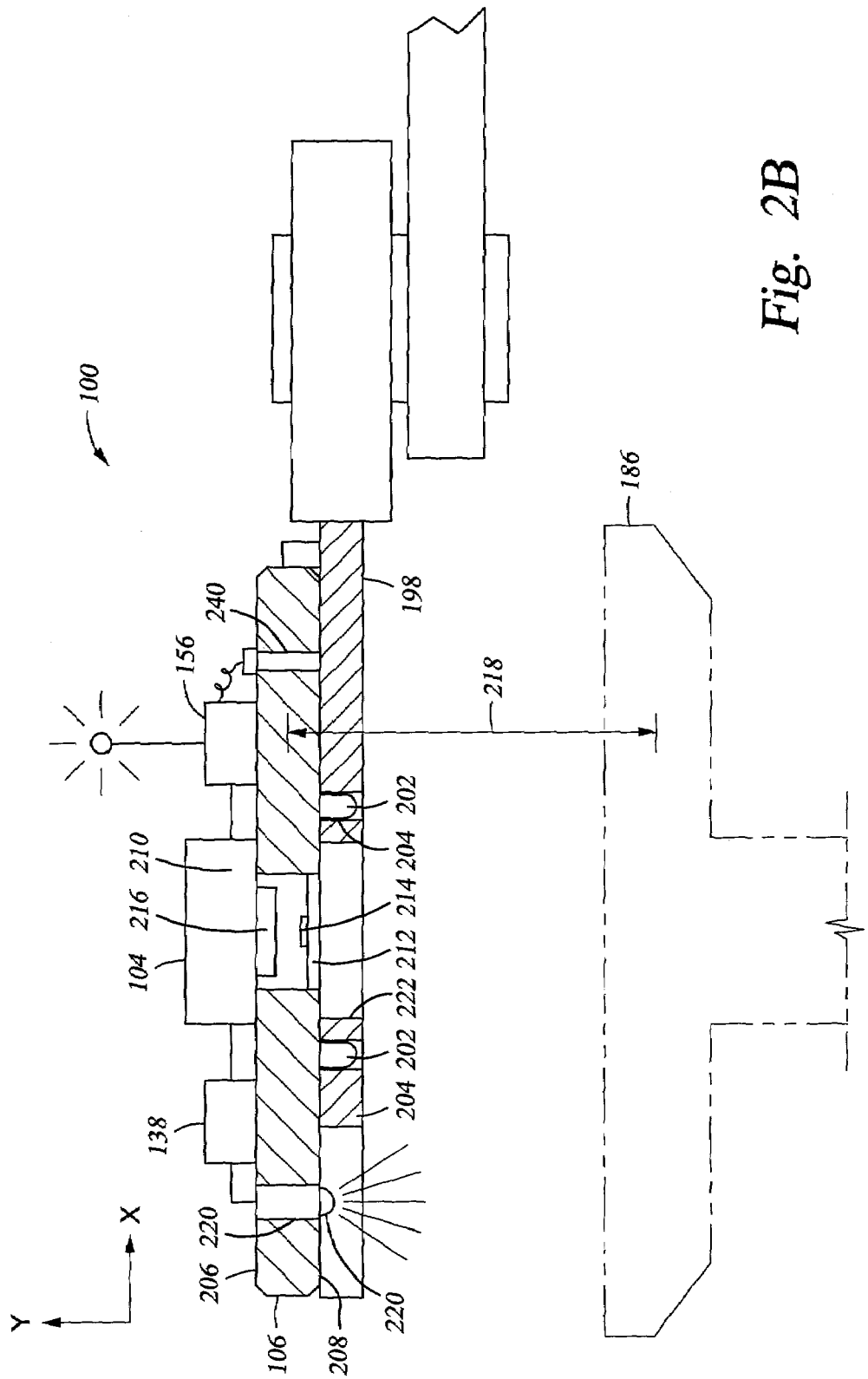
FIG. 2B is a front view of an alternative embodiment of a camera assembly disposed on an end effector of a robot.

In another embodiment of the camera assembly 100 depicted in FIG. 2B, the aperture 210 is filled with a window 212 of a transparent material such as acrylic, quartz or polycarbonate. Alternatively, the entire locating plate 106 may be comprised a transparent material.

The camera 104 is positioned on the second side 208 of the locating plate 106 to position the lens 216 above the window 212. In this position, the camera 104 may view an object, such as a substrate support 186 seen in FIG. 1, through the aperture 210/window 212 to obtain an image that is indicative of a position of the end effector 198 within the system 190. Optionally, the camera 104 may be mounted to the locating plate 106 facing the opposite direction to view images on the second side 208 of the locating plate 106, thereby allowing upper regions of the processing system 190 to be inspected without removing various chamber lids.

The window 212 may optionally include an indicia 214. The indicia 214 provides a reference or "cross-hair" for images taken from the camera 104 through the aperture 210 and the window 212. The indicia 214 may be a circle, cross or other mark suitable for delineating a point of reference. The indicia 214 may be utilized to provide a reference against which the image may be compared. In embodiments wherein an indicia 214 is utilized in the aperture, a lens 216 should be select to provide a depth of field 218 that includes the indicia 214.

Referring back to FIG. 2A, a light 220, powered by the power source 138, may be coupled to the locating plate 106 to illuminate objects below the first side 206 of the plate 106. The light 220 is typically positioned to the side of the aperture 210 to allows a beam generated by the light 220 to illuminate the an object or surface below the aperture 210. In one embodiment, the light 220 is a light emitting diode that extends through a hole 224 in the locating plate 106 (as seen in a top view of one embodiment of the end effector 198 depicted in FIG. 2C). The light 220 may be configure to extend below the end effector 198, either disposed to the outside the end effector 198 or passing through a hole 226 formed in the end effector 198.

A switch 140 is coupled to the locating plate 106 to allow the camera assembly 100 to be activated. The switch 140 be a manual, on/off switch, or may be automatically switched by the controller or other means. In one embodiment, the switch 140 is a proximity sensor, optical sensor, limit switch, or other sensor/switch that senses the presence of the end effector 198 against or proximate the first side 206 of the locating plate 106 when the end effector 198 is disposed below the camera assembly 100. This allows the switch 140 to activate the light 220, camera 104 and transmitter 156 when the camera assembly 100 is supported by the end effector 198 of the robot, thereby conserving battery power.

Figure 3A:
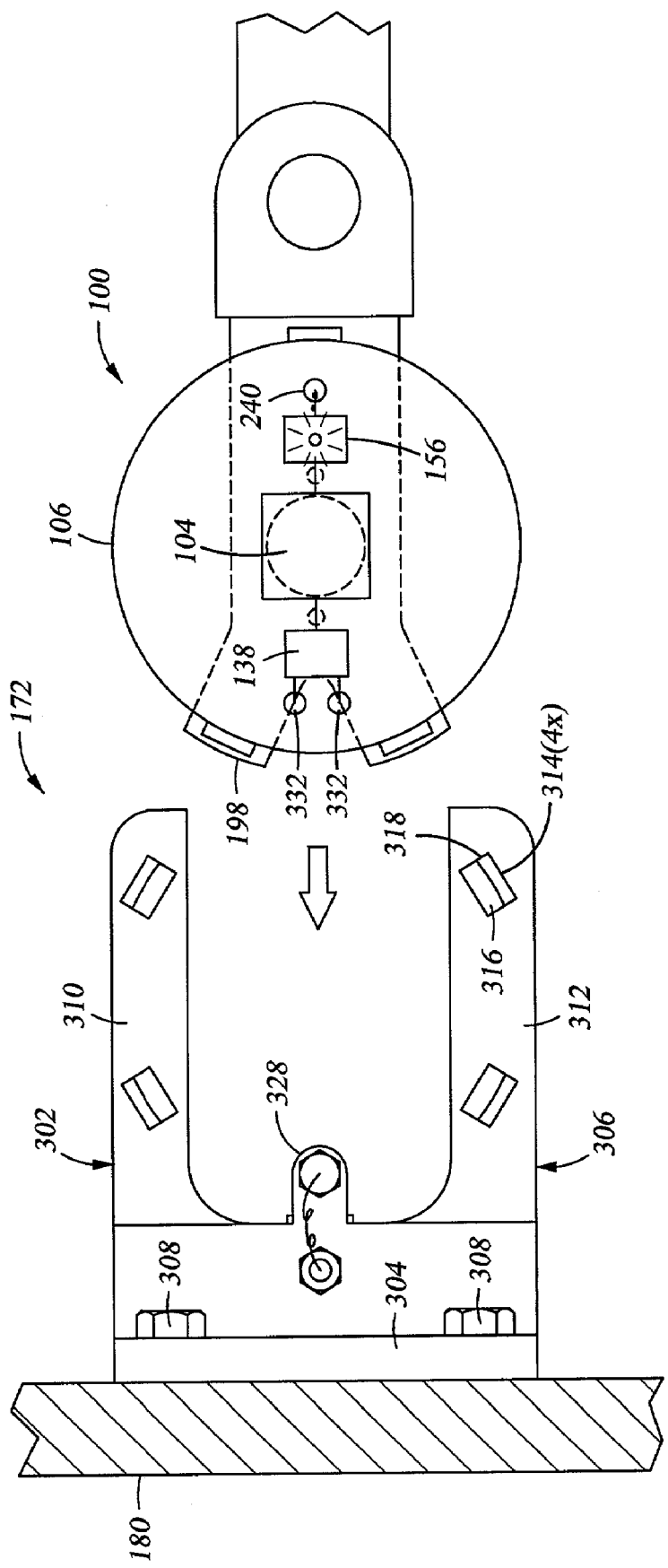
FIGS. 3A–B are top and sectional views of one embodiment of a docking station.
Figure 3B:
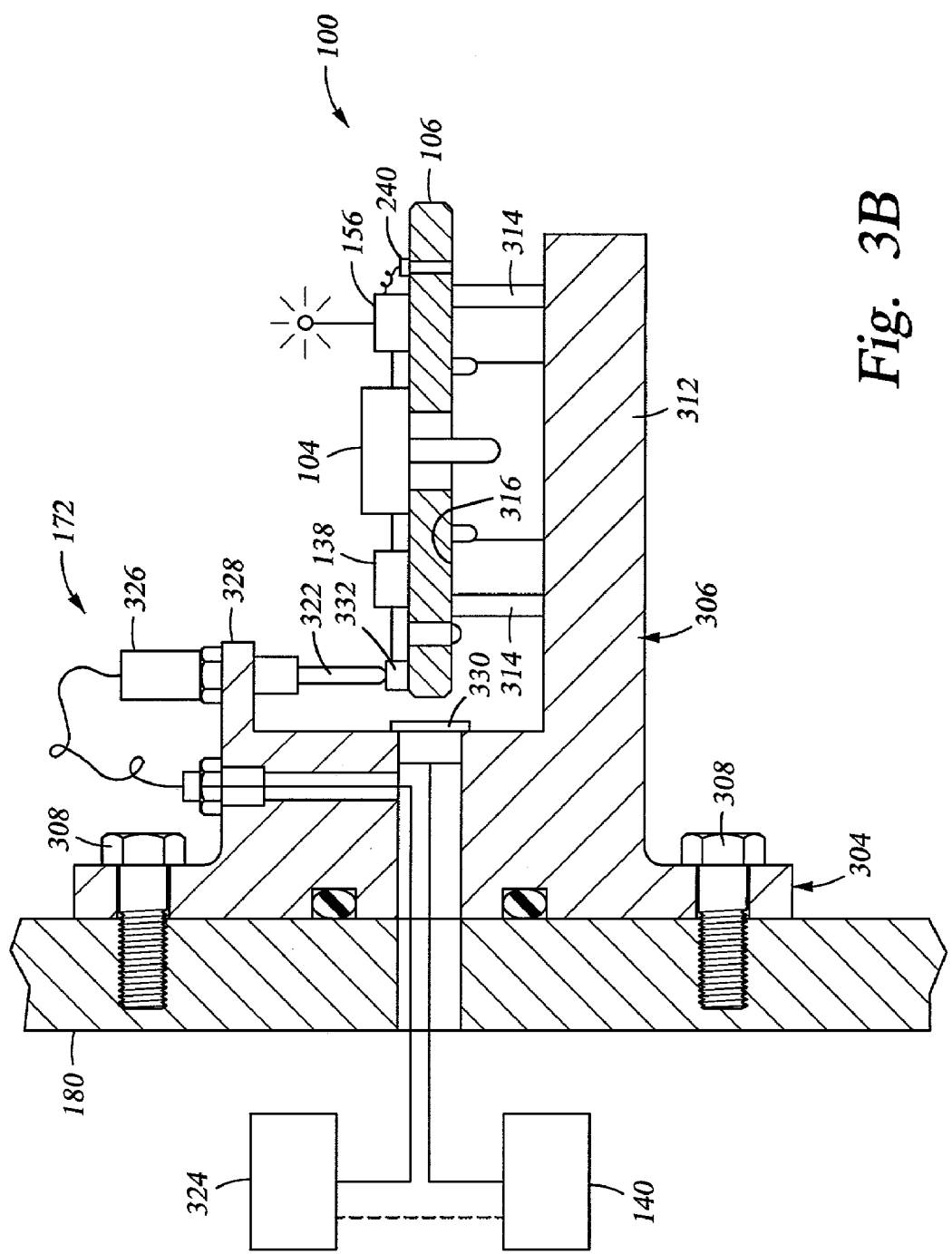

FIGS. 3A–B depict one embodiment of a docking station 172 that is adapted to extend the battery life of the power source 138. The docking station 172 is adapted to support the camera assembly 100 while not in use and generally includes a cradle 302 and a charging mechanism 320. The cradle 302 is configured to support the camera assembly 100 thereon. Since the cradle 302 geometry is highly dependent upon the configuration chosen for the locating plate 106, the cradle 302 may be configured in any number of variations which securely retain the camera assembly 100 while allowing the end effector 198 of the interface robot 182 place and retrieve the camera assembly 100 therefrom.

In one embodiment, the cradle 302 is fabricated from a rigid material such as aluminum, stainless steel or a polymer, and includes a mounting portion 304 and a support portion 306 that extends cantilevered from the mounting portion 304. The mounting portion 304 is coupled to the factory interface 180 by a plurality of fasteners 308.

The support portion 306 includes a first arm 310 and a second arm 312 that extend from the mounting portion 304 in a spaced-apart relation to support the camera assembly 100 when not in use. The arms 310, 312 are spaced to allow the end effector 198 of the robot 182 to pass therebetween, thereby allowing the end effector 198 to place and retrieve the camera assembly 100 from the arms 310, 312 of the support portion 306 without contacting the cradle 302.

Each arm 310, 312 includes a pair of support posts 314. Each support post 314 includes a seat 316 for supporting the camera assembly 100 and a lip 318 for preventing the camera assembly 100 for retaining the camera assembly 100 on the seat 316.

Optionally, the cradle 302 may include a charging mechanism 320. The charging mechanism 320 is adapted to recharge the power source 138 of the camera assembly 100 while stored on the cradle 302 between uses. In one embodiment, the charging mechanism 320 includes a pair of contact pins 322 that are coupled to a charger 324 disposed externally to the system 190. The contact pins 322 are coupled by an actuator 326 to a tab 328 extending from the mounting portion 304.

A sensor 330, such as a proximity sensor or limit switch, is coupled to the cradle 302 to detect the presence of the camera assembly 100. When the camera assembly 100 is detected, the actuators 326 move the contact pins 322 in contact with a pair of conductive contact pads 332 disposed on the camera assembly 100. The contact pads 332 are coupled to the respective polls of the power source 138, thus electrically coupling the power source 138 to the charger 324 through the contact pins 322 to recharge the power source 138 between uses. Once the power source 138 is fully charged, or the controller 140 directs the robot 182 to retrieve the camera assembly 100, the actuator 326 lifts the pins 322 clear of the camera assembly 100 to allow the robot 182 to lift the camera assembly 100 from the docking station 172 without contacting the pins 322.

The controller 140 may be configured to monitor charging of the power source 138 so that charging is terminated once the power source 138 is returned to a predetermined charge level. Alternatively, other means, such as a dedicated logic circuit (not shown) mounted locally to the docking station 172 may be utilized to control and/or monitor changing, along with controlling the actuation of the contact pins 322.

Referring back to FIG. 1, the controller 140 receives image information viewed by the camera 104. The image information may be processed by the controller 140 to determine the position of the end effector and/or to provide views of portions of the processing system. In the embodiment depicted in FIG. 1, the controller 140 displays an image 152, for example, an image of the substrate support 186 disposed in one of the processing chamber 192, on the monitor 148 to facilitates viewing of the image 152 by an operator.

In one mode of operation, the image 152 displayed on the monitor 148 may be utilized to manually jog the robot 196 to place the end effector 198 in a predefined position or target, for example, over a vacuum port formed in the substrate support 186, the image of which is displayed on the monitor 148 as port image 170. To facilitate the distance needed to move the end effector 198, the display 150 may optionally project a grid 158. The grid 158 is configured to allow the distance between the target's image, e.g., the port image 170, and an image 160 of the indicia to be resolved by counting the number of grid lines between the port image 170 and the indicia's image 160 along each axis.

Figure 4:
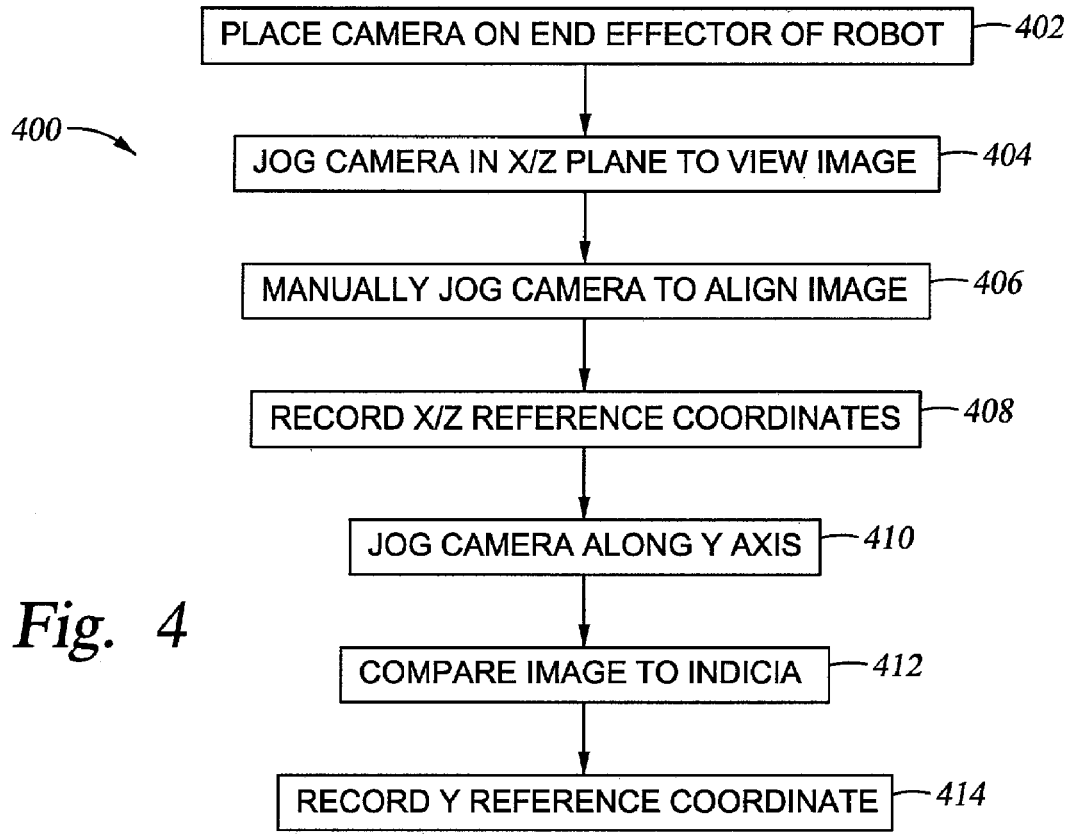
FIG. 4 depicts a flow diagram of one mode of operation of the vision system of FIG. 1.

FIG. 4 is a flow diagram depicting one embodiment of a calibration procedure 400 that may be utilized to find robot reference coordinates that place the end effector in a predefined position. Such locations include, but are not limited to, any position where a substrate is placed or retrieved by a robot of the system 190. Although the procedure 400 is described as aligning the end effector 198 of the transfer robot 198 with a substrate support 186 of one of the processing chamber 194, the procedure 400 may be utilized in other locations within the range of motion of any system robot to calibrate the robot's position at that location. At step 402, the camera assembly 100 is positioned on the end effector 198 of the transfer robot 196. This step may include transferring the camera assembly 100 from a location remote to the robot 196. At step 404, the robot 196 is jogged in an x/z plane to a position within the processing chamber 192 so that the image 152 of the substrate support 186 is displayed on the monitor 148. At step 406, the robot 196 is manually jogged in the x/z plane to align the indicia 214 with a predetermined portion of the image 152 or target, for example, the port image 170. At step 408, the aligned position of the end effector 198 is recorded as reference coordinates in the x/z plane.

Once the port image 170 and indicia are aligned, the elevation of the end effector 198 is moved to a predetermined position by jogging the end effector 198 of the robot 196 along a y axis at step 410. Arrival in the predetermined position may be determined by comparing the relative size of the indicia 152 the port image 170 at step 412. This comparison may be facilitated by utilizing an indicia 212 that matches the size and/or geometry of the target (i.e., the port image 170) when the end effector 198 of the robot 196 is at the proper elevation. At step 414, the elevation of the end effector 198 is recorded as a reference coordinate along the y axis.

Figure 5:
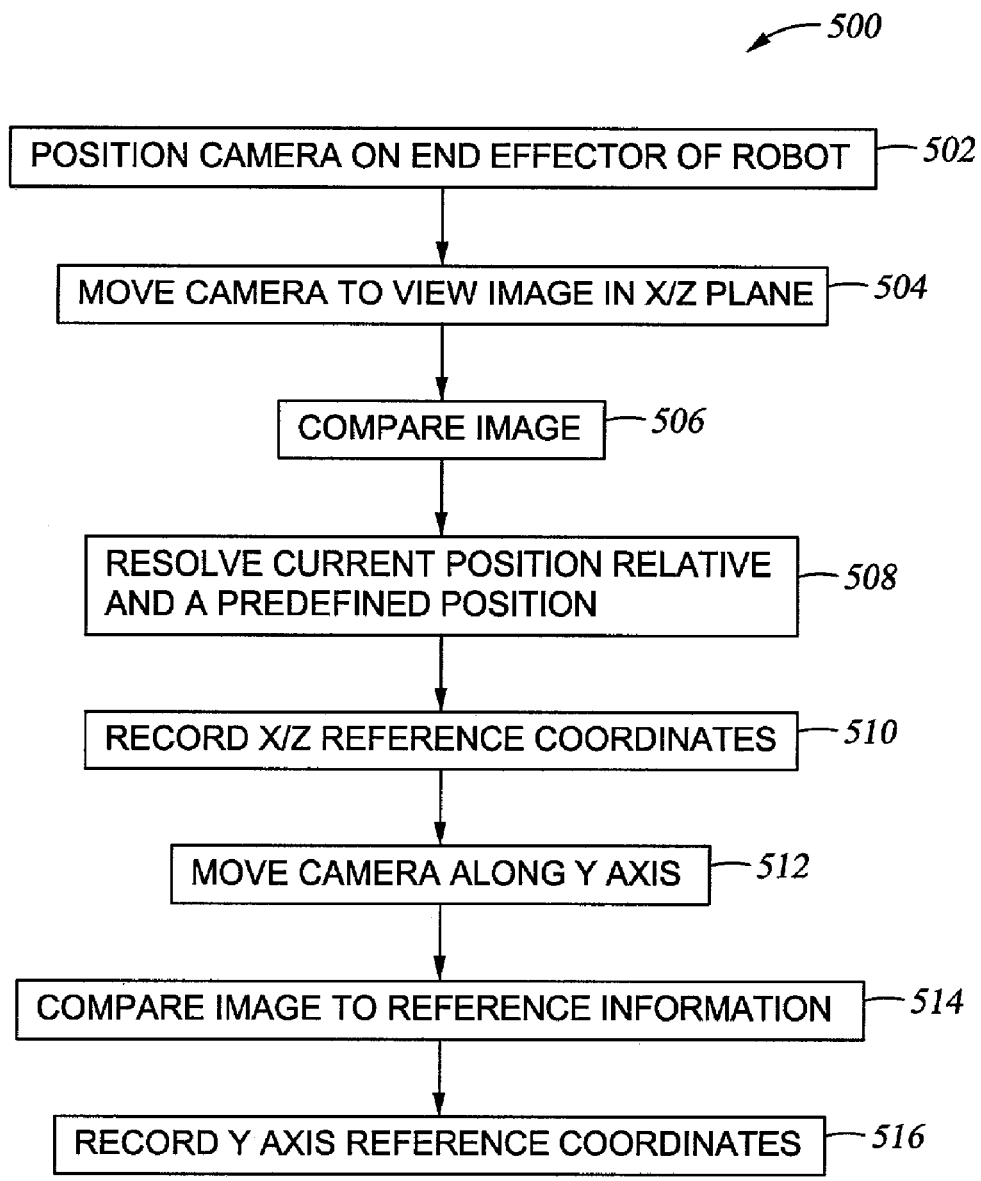
FIG. 5 depicts a flow diagram of another mode of operation of the vision system of FIG. 1.

FIG. 5 is a flow diagram depicting another embodiment of a calibration procedure 500 that may be utilized to find robot reference coordinates that place the end effector in a predefined position. Although the procedure 500 is described as aligning the end effector 198 of the transfer robot 198 with a substrate support 186 of one of the processing chamber 194, the procedure 500 may be utilized in other locations within the range of motion of any system robot to calibrate the robot's position at that location. At step 502, the camera assembly 100 is positioned on the end effector 198 of the transfer robot 196. At step 504, the controller 140 directs the robot 196 to a position within the processing chamber 192 so that the image 152 of the substrate support 186 is viewed by the camera 104. At step 506, the controller 140 compares the image 104 viewed by the camera 104 with a reference image stored in the memory 142 of the controller 140. At step 508, the controller 140 resolves a distance between the current position of the robot 196 and the predefined position in the X/Z plane and moves the end effector 198 accordingly. Steps 506 and 508 are iteratively repeated until the end effector 198 of the robot 196 reaches the predefined position where the X/Z reference coordinates of the end effector 198 are recorded by the controller 140 at step 510.

Once the X/Z reference coordinates of the end effector 198 are obtain, the elevation of the end effector 198 is moved to a predetermined position by moving the end effector 198 of the robot 196 along the y axis at step 512. Arrival in the predetermined position may be determined by comparing the relative size of the image viewed by the camera 104 to reference information at step 514. For example, the elevation of the camera 104 may be adjusted until a number of pixels of the target image equal a predetermined quantity. In one alternative example, the relative side of the target image may be compared to the indicia 212 viewed by the camera 104. When the end effector 198 of the robot 196 reaches the predefined Y axis position, the Y reference coordinates of the end effector 198 are recorded by the controller 140 at step 516. It is contemplated that the X, Y and Z reference coordinates may be obtained in any order, including simultaneously.

Figure 6:
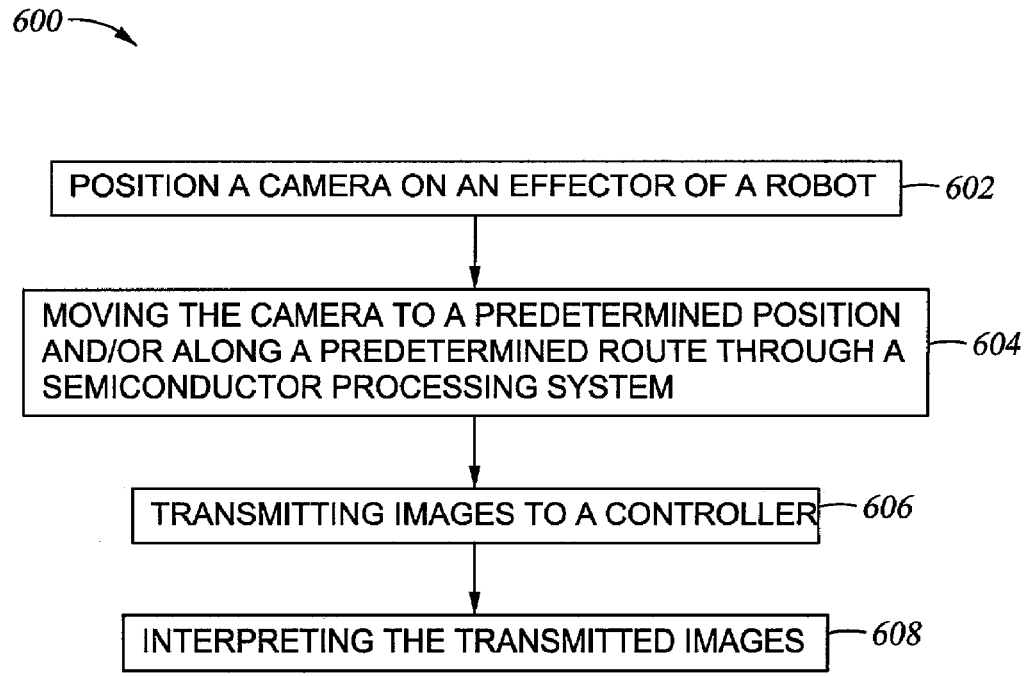
FIG. 6 depicts a flow diagram of another mode of operation of the vision system of FIG. 1.

FIG. 6 depicts another method 600 in which the invention may be utilized. At step 602, the camera assembly 100 is positioned on the end effector 198 of the transfer robot 196 (or other robot of the system 190). At step 604, the controller 140 directs the robot 196 to move the camera assembly 100 to a predetermined position and/or along a predetermined route through the system 190. At step 606, images are transmitted to the controller 140. At step 608, the transmitted images are interpreted by the controller 140. For example, the images may be displayed on the monitor 148 for visual inspection of the interior of the system 190. Alternatively, the images may be compared with reference images stored in the memory 142 of the controller 140. The images may also be utilized for other proposes, for example, sales or technical demonstrations.

Figure 7:
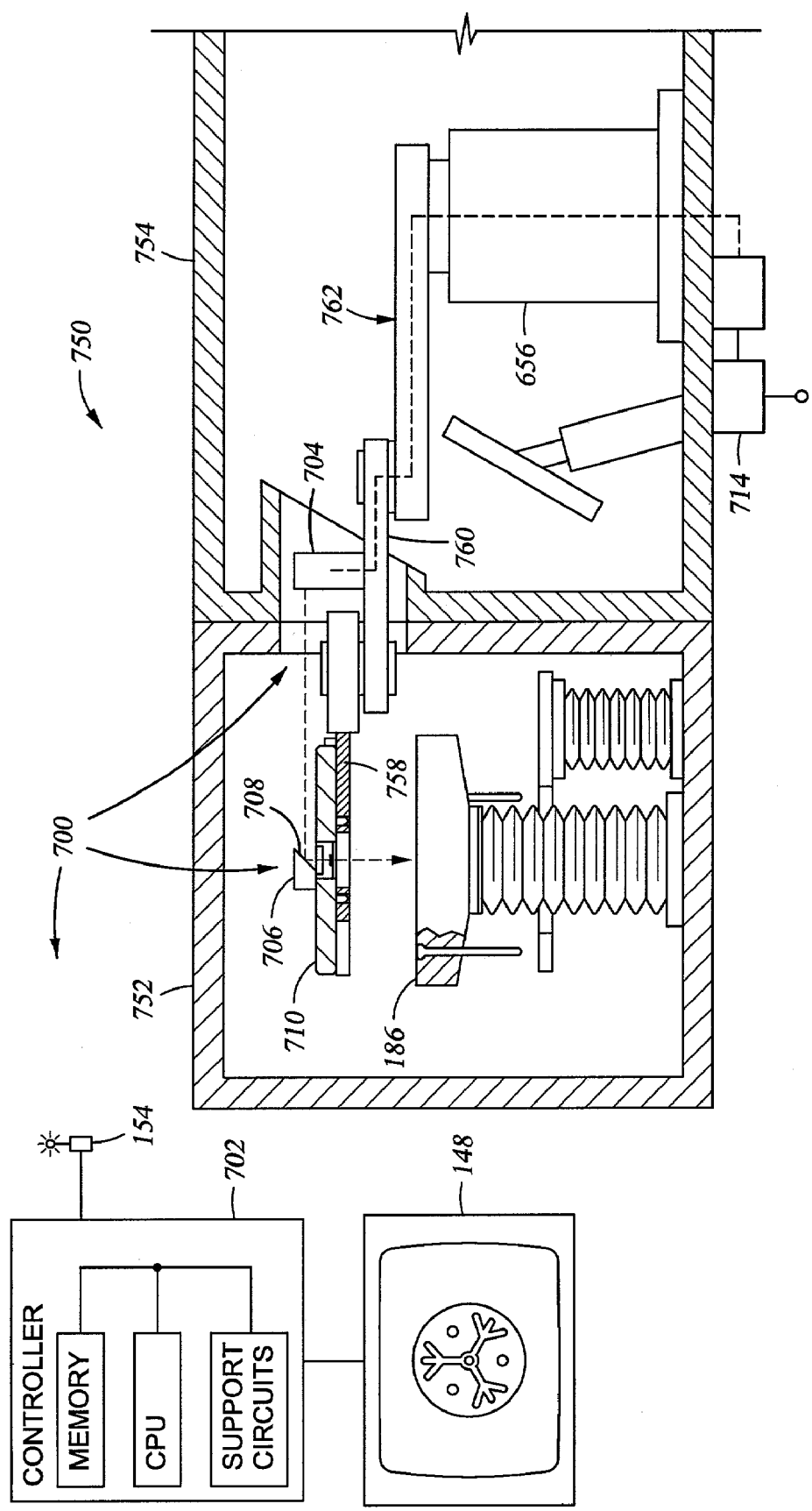
FIG. 7 depicts another embodiment of a vision system.

FIG. 7 depicts another embodiment of a vision system 700 that may be utilized to obtain images of a processing system 750. The processing system 700 is substantially similar to the processing system 190 described with reference to FIG. 1, and accordingly, only a single processing chamber 752 coupled to a transfer chamber 754 having a transfer robot 756 disposed therein is shown for the sake of brevity.

The vision system 700 generally includes a controller 702, a camera 704 and a reflector 706. The reflector 706 is typically coupled to the end effector 758 at an orientation that allows images to be viewed by the camera 704 that are outside the camera's field of view. The reflector 706 may be fastened, bonded or otherwise attached to the end effector 758. Alternatively, the reflector 706 may be coupled to a locating plate 710 that is configured similarly to the locating plate 106 described above so that the reflector 706 (and locating plate) may be removed from the end effector when not in use.

In the embodiment depicted in FIG. 7, the reflector 706 is coupled to an underside 720 of the end effector 758 and includes a reflective surface 708. The reflective surface 708 is typically fabricated from polished stainless steel or other material that provides an optical quality reflection. The reflective surface 708 is orientated at about 45 degrees relative to the field of view of the camera 704. Thus, images of objects below the end effector 758 and outside of the camera's field of view may be captured by the camera 704 positioned remotely from the processing chamber 752. The captured images may be used for inspection or calibration as discussed above.

The reflector 706 may be configured to allow the camera 704 to view objects at predefined positions within the system 750 by changing the angular orientation of the reflective surface 708. The reflector 706 may be configured to provide images above, below or along side the end effector 758. Alternatively, the reflector 706 may be a prism, lens or other optical device that is adapted to provide images outside of the camera's field of view.

The reflector 706 may alternatively coupled to a locating plate in a in a manner that allows the reflector 706 to be moved relative to the end effector 758.to allow a greater number of objects to be viewed by the camera 704 which as a fixed line of sight. A reflector having controllable positioning is described below with reference to FIG. 11.

The controller 702 and camera 704 generally similar to the controller 140 and camera 104 described above. The camera 704 is typically mounted to a portion of the transfer robot 756 that remains external to the processing chamber 752 (e.g., remains in the transfer chamber 754) when an end effector 758 of the robot 756 is inserted into the processing chamber 752. The mounting of the camera 704 in a position that does not enter the processing chamber 752 facilitates use of the vision system 700 in hotter environments that may damage the camera. Thus, images may be obtained in a hot processing chamber without waiting for cooling.

In an embodiment of a vision system 700 coupled to a factory interface robot, for example the robot 182 depicted in FIG. 1, the camera 704 may be coupled to any portion of the interface robot that maintains the reflector 706 within the camera's field of view since the environment accessed by an interface robot is generally more hospitable than environments in which an end effector of the transfer robot is exposed.

In one embodiment, the camera 704 is coupled to a wrist 760 that couples the end effector 758 to a linkage 762 of the transfer robot 756. Alternatively, the camera 704 may be coupled linkage 762 or positioned statically within the transfer chamber 760. As the camera 704 is coupled to system 750 through the transfer robot 756, a local power source 712 and a transmitter 714 are not required as the camera 704 may be hardwired to the controller 702 through the robot 756 and transfer chamber 754. Alternatively, a power source and transmitter, similar to the power source 138 and transmitter 156 described above may be coupled to the camera 704 on the robot 756 or nearby on the system 750.

Figure 8:
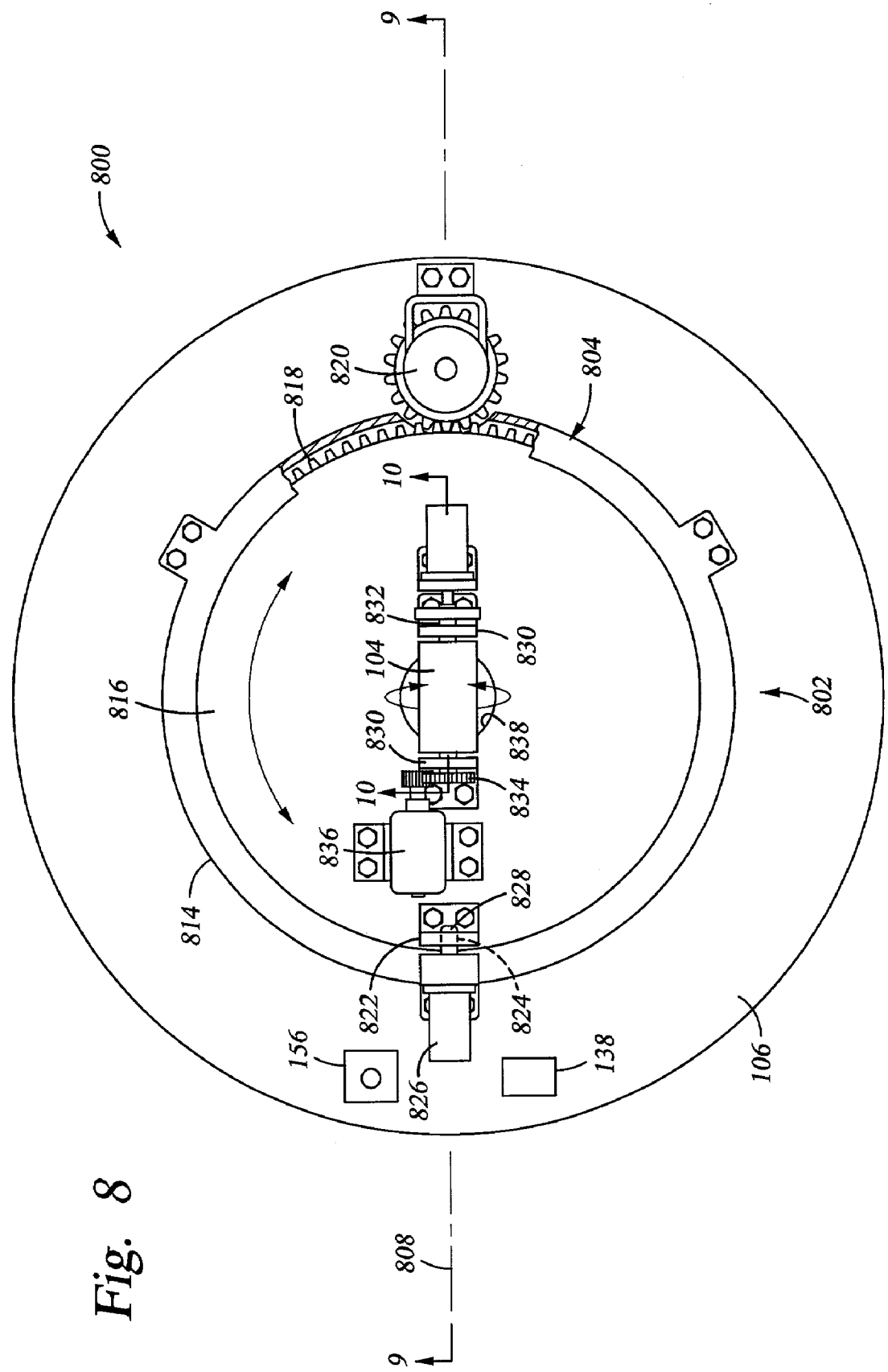
FIG. 8 is a plan view of one embodiment of camera assembly having a gimbal system.

FIG. 8 is a plan view of another embodiment of a camera assembly 800. The camera assembly 800 is similar to the camera assembly 100 described above, except that a camera 104 of the camera assembly 800 is movably mounted to the camera assembly 800. The camera 104 may be directs to view objects without moving robot or end effector (not shown) by changing the line of sight of the camera 104 relative to a locating plate 106 that supports the camera 104. The movement of the camera 104 relative to the locating plate 104 is facilitated by a gimbal assembly 802. The gimbal assembly 802 may be any device capable of changing the orientation of the camera 104, for example, a ball joint, universal joint or other mechanism able to change the view of the camera 104 through at least one plane.

In the embodiment depicted in FIG. 8, the gimbal assembly 802 includes a turntable assembly 804 having a pivot assembly 806 coupled thereto. The pivot assembly 806 has the camera 104 mounted thereto and is adapted to rotate the camera 104 relative an axis 808 disposed parallel to the locating plate 106. The turntable assembly 804 is adapted to rotate about an axis 810 perpendicular to the axis 808 and concentric with an aperture 210 disposed through the locating plate 106. The turntable assembly 804 is adapted to rotate the camera 104 about the axis 810.

Figure 9:
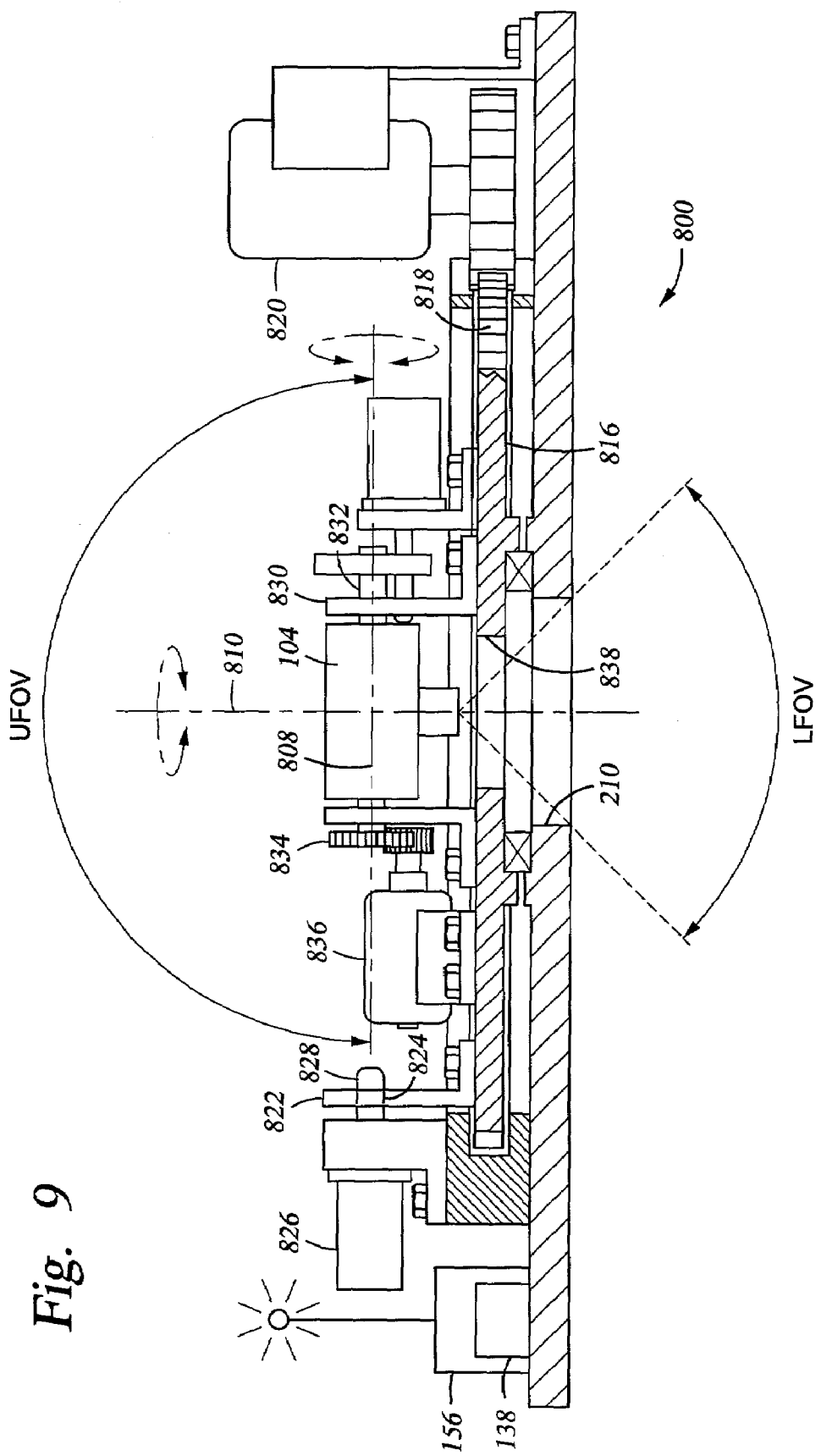
FIG. 9 is a sectional view of the gimbal system taken along section line 9—9 of FIG. 8.

Referring additionally to the sectional view of FIG. 9, the turntable assembly 804 includes a race 814 that retains a turntable 816. The turntable 816 have a toothed perimeter 818 that is intermeshed with a drive motor 820. The drive motor 820 is coupled to the controller 140 that provides instructions to the motor 820 to control the rotational orientation of the turntable 816.

The turntable 816 includes a tab 822 coupled thereto proximate the perimeter 818. The tab 822 has a hole 824 formed at least partially therethrough that is adapted to interface with a piston 828 of an actuator 826 coupled to the locating plate 106. When the turntable 816 is in a predetermined angular orientation, the piston 828 may be actuated to engage the hole 824 thereby locking or fixing the position of the turntable 816 about the axis 810.

The pivot assembly 806 has a pair of brackets 830 that straddle an aperture 838 formed in center of the turntable 816 that aligns with the aperture 210 of the locating plate 106. The camera 104 is pivotally supported between the brackets 830 by a shaft 832 disposed along the axis 808. One end of the shaft 832 includes a gear 834 that interfaces with a drive motor 836 coupled to the turntable 816. The drive motor 836 is coupled to the controller 140 that provides instructions to the motor 836 to control the rotational orientation of the camera 104 relative to the brackets 830 about the axis 808. Thus, the turntable assembly 804 and pivot assembly 804 may orientate the camera 104 to have an upper hemispherical field of view (UVOF) and a lower conical view of view (LFOV) through which images may be obtained.

Figure 10:
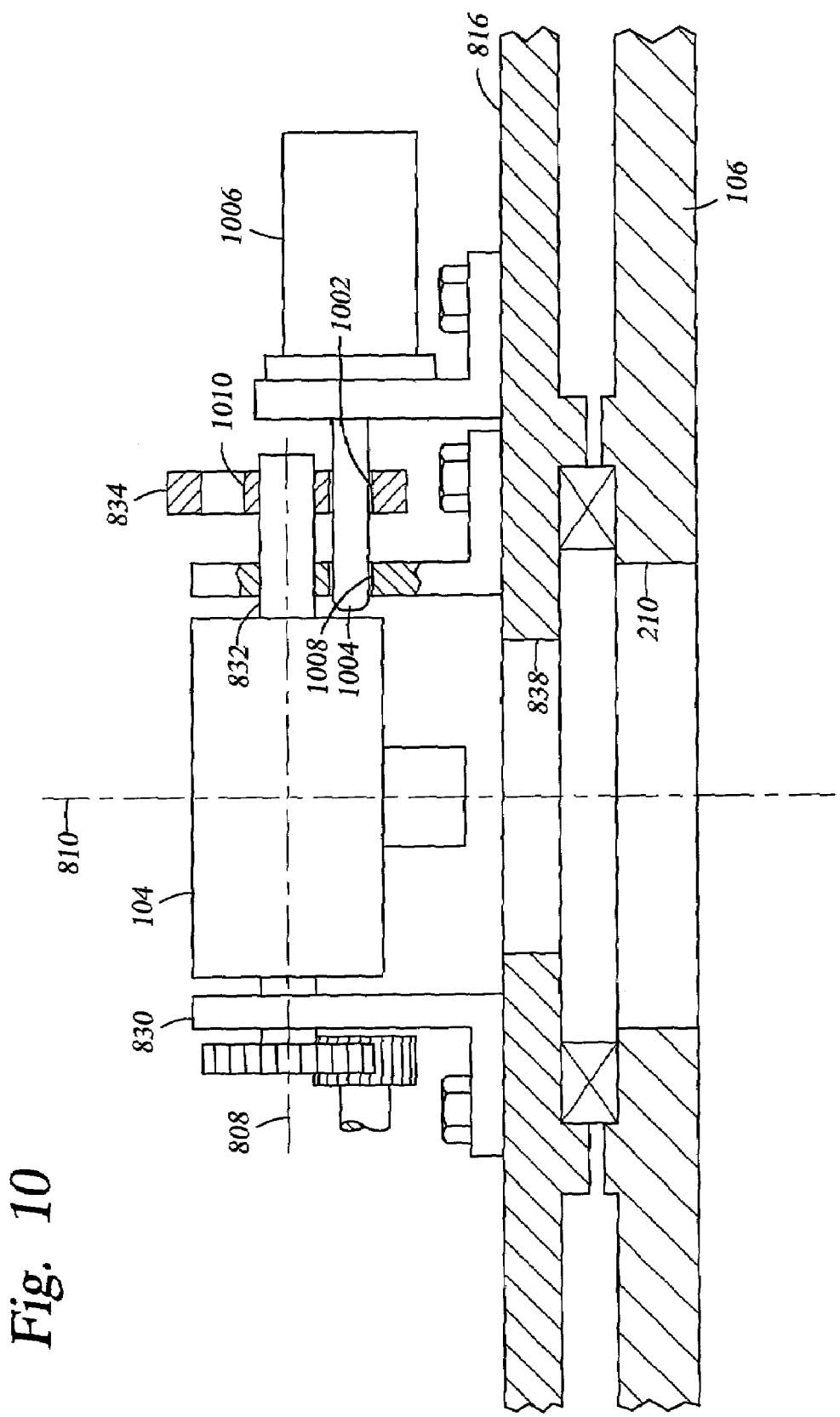
FIG. 10 is a sectional view of the gimbal system taken along section line 10—10 of FIG. 8.

Referring additionally to FIG. 10, the gear 834 includes at least a first locating hole 1002 formed at least partially therethrough. The hole 1002 is adapted to interface with a piston 1004 of an actuator 1006 coupled to the turntable 816. When the gear 834 is in a predetermined angular orientation, for example, when the camera 104 is capturing (e.g., facing) along the axis 810 through the aperture 210 in the locating plate 106, the piston 1004 may be actuated to engage the hole 1002 thereby locking or fixing the orientation of the camera 104 about the axis 808. A hole 1008 may be provided in the bracket 830 to receive the piston 1004 after passing through the hole 1002 in the gear 834 to more securely retain the gear 834. Alternatively (or in addition), a second hole 1010 may be at least partially formed through the gear 834 in a location rotated 180 degrees about the axis 808 relative to the first hole 1002 to orientate the camera 104 in an upward viewing position.

In one embodiment, the gimbal assembly 802 may be locked (by actuating pistons 828, 1004 to retain the camera 104 in a orientation that views along axis 810 through the aperture 210. In this locked condition, positional calibration of a robot may be accurately obtained through the methods described above. Moreover, in the unlocked position, the camera 104 may be swiveled in a variety of directions, both while the robot is motionless and while motion, to obtain view from substantially the entire system, which may advantageously be utilized for inspection of the system substantially without interruption of normal processing routings and without loss of vacuum within the regions of the system being inspected.

Figure 11:
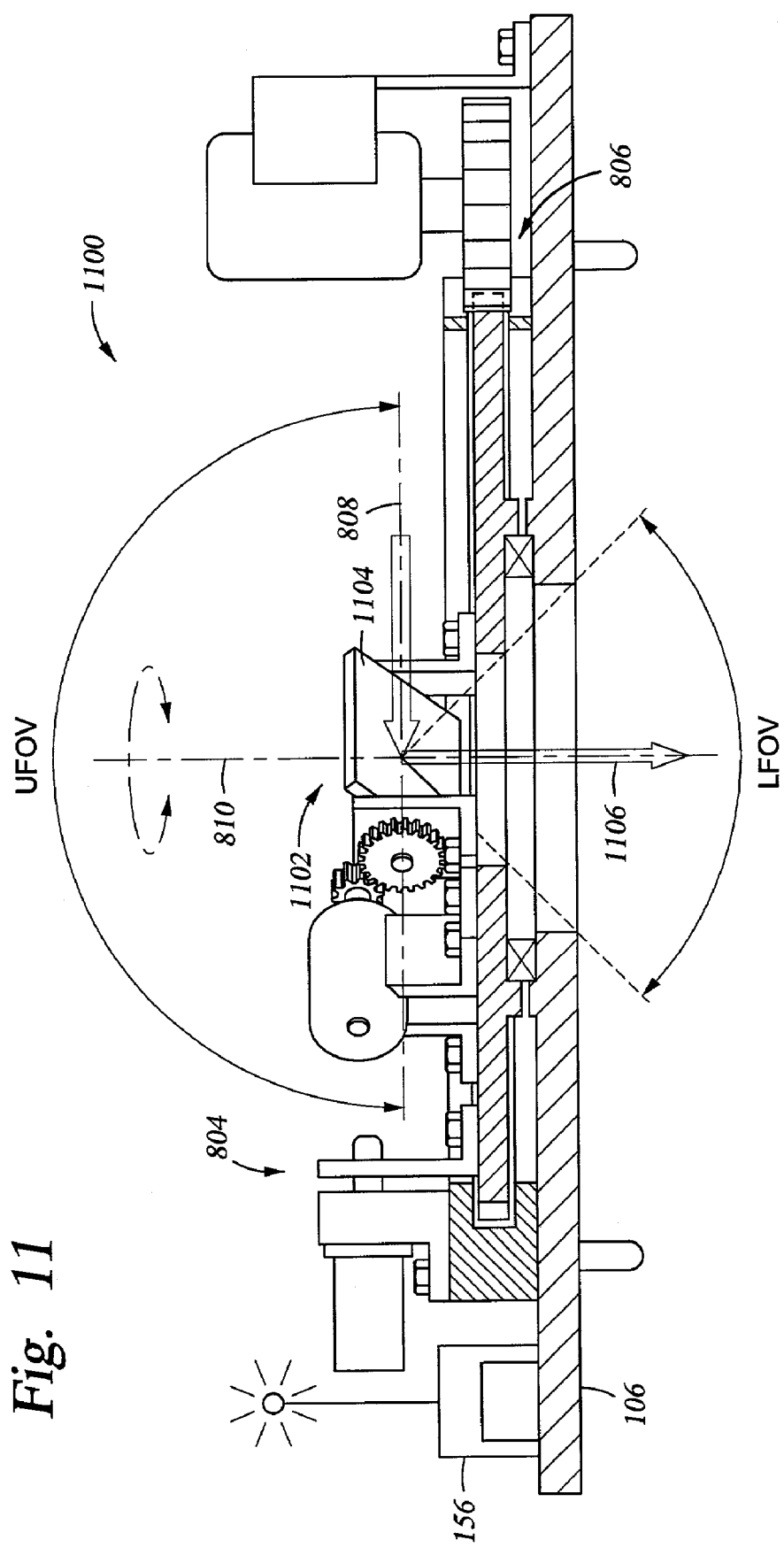
FIG. 11 is sectional view of another embodiment of a camera assembly.

FIG. 11 depicts a reflector assembly 1100 that may be utilized in lieu of the reflector 704 in the vision system 700 described above with reference to FIG. 7. The reflector assembly 1100 is generally similar to the camera assembly 800, except that a gimbal assembly 802 of the reflector assembly 1100 controls an orientation of a reflector 1102. Thus, the camera 704 (shown in FIG. 7) may view images of objects reflected in the reflector 1102 that are outside of the camera's line of sight moving robot or end effector (not shown) by changing the angle/orientation of the reflector 1102 relative to the camera 104 as depicted by arrow 1106.

In the embodiment depicted in FIG. 11, the gimbal assembly 802 is disposed on a locating plate 106 and includes a turntable assembly 804 having a pivot assembly 806 coupled thereto. The pivot assembly 806 has the reflector 1102 mounted thereto and is adapted to rotate the reflector 1102 relative an axis 808 disposed parallel to the locating plate 106. The turntable assembly 804 is adapted to rotate about an axis 810 perpendicular to the axis 808. The turntable assembly 804 is adapted to rotate the reflector 1102 about the axis 810. The combination of motions between the turntable assembly 804 and the pivot assembly 806 allow a reflective surface 1104 of the reflector 1102 to be orientated so that the camera 704 may capture images of objects above, below and along side the locating plate 106 as the orientation of the reflector 1102 is positioned as instructed by the controller 140.

Thus, a vision system is provided that facilitates capturing images within a semiconductor processing system. The vision system allows calibration and inspection procedures to be performed with minimal operator interaction and without exposing the interior of the system to the ambient environment. Moreover, the vision system provides for in-situ inspection and calibration under vacuum conditions and at or near operating temperatures to provide more accurate positional data of a robot's position that may also be obtained without interruption of substrate processing.

Although various embodiments which incorporate the teachings of the present invention have been shown and described in detail herein, those skilled in the art can readily devise many other varied embodiments that still incorporate these teachings.

What is claimed is:

1. A vision system for a semiconductor processing system comprising:
    at least one robot adapted for use in a semiconductor processing system;
    an end effector coupled to the robot;
    a camera selectively positioned by the robot;
    a transmitter coupled to the camera;
    a receiver for receiving images transmitted by the camera; and
    a docking station for supporting the camera when not carried by the end effecter.

2. The system of claim 1, wherein the robot is housed in a vacuum chamber.

3. The system of claim 1 further comprising a plate having the camera coupled thereto.

4. The system of claim 3, wherein the plate further comprises:
    an aperture formed therethrough; and
    the camera adapted to obtain an image through the aperture.

5. The system of claim 3, wherein the end effector of the robot further comprises:
    a hole formed therethrough adapted allow the camera to view therethrough.

6. The system of claim 3, wherein the plate further comprises:
    at least one locating pin extending therefrom and received in a hole formed in the end effector.

7. The system of claim 1, wherein the camera is orientated to capture images above the end effector.

8. The system of claim 1, wherein the camera is orientated to capture images below the end effector.

9. The system of claim 1, wherein the semiconductor processing system further comprises:
    one or more processing chambers coupled to a transfer chamber, wherein the camera is adapted to capture images within the process chambers.

10. The system of claim 1 further comprising:
    at least one system component selected from a group consisting of a factory interface, a load lock chamber and a substrate storage cassette.

11. The system of claim 1 further comprising:
    a battery coupled to the transmitter.

12. The system of claim 11 further comprising:
    a docking station for supporting the support plate when not carried by the end effector.

13. The system of claim 1, wherein the docking station further comprises:
    an apparatus for recharging the battery.

14. The system of claim 13, wherein the docking station further comprises:
    at least one electrical contact disposed against an electrical contact formed in the plate or the battery, wherein the electrical contacts provide a current path to recharge the battery.

15. The system of claim 1 further comprising:
    a plate for supporting the camera; and
    a switch coupled to the plate for activating the transmitter.

16. The system of claim 15, wherein the switch changes state in response to the proximity of the end effector.

17. The system of claim 15, wherein the switch changes state in response to the proximity of a docking station that supports the plate when not in use.

18. The system of claim 1 further comprising:
    a plate disposed on the end effector; and
    a reflector coupled to the plate for allowing the camera to view images outside of a field of view of the camera.

19. The apparatus of claim 1, wherein the camera may swivel about at least a first axis.

20. The apparatus of claim 19 further comprising a lacking mechanism to temporally fix an orientation of the camera about the first axis.

21. The apparatus of claim 1, wherein the camera may swivel about two axes.

* * * * *

UNITED STATES PATENT AND TRADEMARK OFFICE
CERTIFICATE OF CORRECTION

PATENT NO.         : 7,085,622 B2
APPLICATION NO. : 10/126493
DATED              : August 1, 2006
INVENTOR(S)        : Sadighi et al.

It is certified that error appears in the above-identified patent and that said Letters Patent is hereby corrected as shown below:

In column 4, line 4, delete "Inc," and insert -- Inc., --, therefor.
In column 4, line 18, delete "VHP)" and insert -- VHP --, therefor.
In column 5, line 36, delete "loading plate" and insert -- locating plate --, therefor.
In column 6, line 41, delete "cameral 104" and insert -- camera 104 --, therefor.
In column 10, line 48, delete "758.to" and insert -- 758 to --, therefor.
In column 12, line 22, delete "(by" and insert -- by --, therefor.
In column 13, line 20, in Claim 1, delete "effecter." and insert -- effector. --, therefor.
In column 14, line 38, in Claim 20, delete "lacking" and insert -- locking --, therefor.

Signed and Sealed this

Nineteenth Day of December, 2006

JON W. DUDAS
*Director of the United States Patent and Trademark Office*